United States Patent [19]

Buchheister, Jr. et al.

[11] Patent Number: 5,580,271
[45] Date of Patent: Dec. 3, 1996

[54] SCSI CABLE WITH TERMINATION CIRCUIT AND METHOD OF MAKING

[75] Inventors: Raymond R. Buchheister, Jr., Fairfield; Robert Scata, Harrisburg; Robert J. Hnatuck, Mechanicsburg, all of Pa.

[73] Assignee: The Whitaker Corporation, Wilmington, Del.

[21] Appl. No.: 303,253

[22] Filed: Sep. 8, 1994

[51] Int. Cl.$^6$ .................................................. H01R 9/07
[52] U.S. Cl. ............................................................ 439/493
[58] Field of Search ............................. 439/77, 492, 493, 439/494, 874, 876, 76.1

[56] References Cited

U.S. PATENT DOCUMENTS

| | | | |
|---|---|---|---|
| 4,023,879 | 5/1977 | Braund et al. | 439/76.1 |
| 4,731,031 | 3/1988 | Lenke | 439/76.1 |
| 4,932,873 | 6/1990 | La Shier | 439/77 |
| 5,090,116 | 2/1992 | Henschen et al. | 29/827 |
| 5,093,987 | 3/1992 | Scholz | 29/860 |
| 5,103,071 | 4/1992 | Henschen et al. | 219/85.22 |
| 5,211,578 | 5/1993 | Henschen et al. | 439/494 |
| 5,272,807 | 12/1993 | Henschen et al. | 29/863 |
| 5,387,131 | 2/1995 | Foreman et al. | 439/620 |

Primary Examiner—Neil Abrams
Assistant Examiner—Barry Matthew L. Standig

[57] ABSTRACT

An SCSI cable assembly (30) with a termination circuit included within one of the connector housings (44) is disclosed. The termination circuit is on a circuit board (52) that is retained within a cavity (68) between two solder nest halves (50). The solder nest halves (50) have a plurality of openings (70) that are in alignment with contact pads (54) on a surface of the circuit board (52). Solder segments (100) are arranged within the openings (70), and conductors (48) of a cable (32) are individually inserted into the openings in thermal engagement with the solder segments to form a solder nest assembly (40). An electrical connector (42) having a plurality of contact leads (58) spaced similarly to the spacing of the openings (70) is assembled to the solder nest assembly so that each lead (58) is in thermal engagement with a respective conductor (48) in a respective opening (70). Each lead (58) is attached to a common carrier strip (104) which is a self regulating temperature heater. The heater is activated by application of an RF current to reflow the solder segment (100) thereby electrically connecting the leads (58) to their respective conductors (48) and contact pads (54).

12 Claims, 7 Drawing Sheets

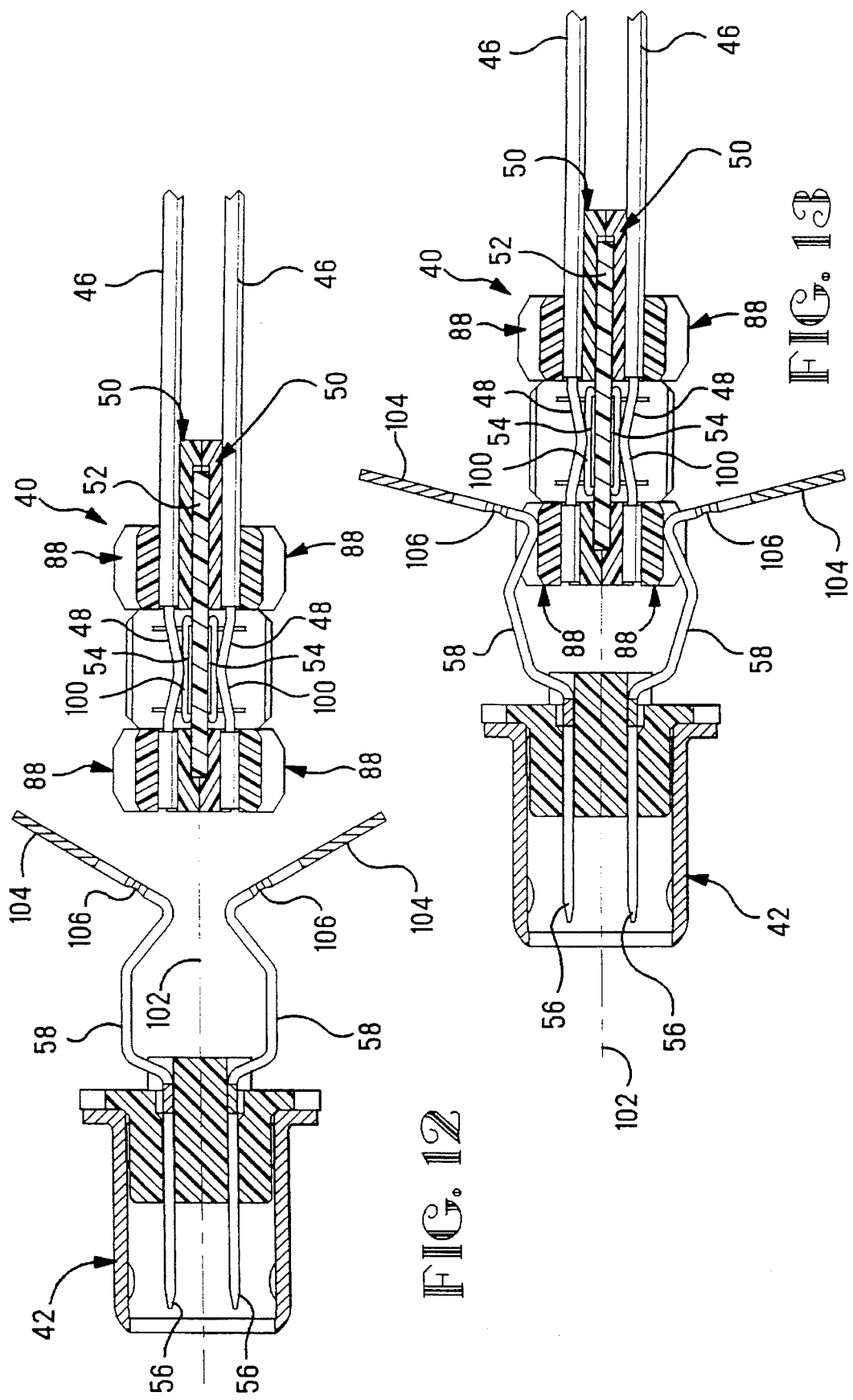

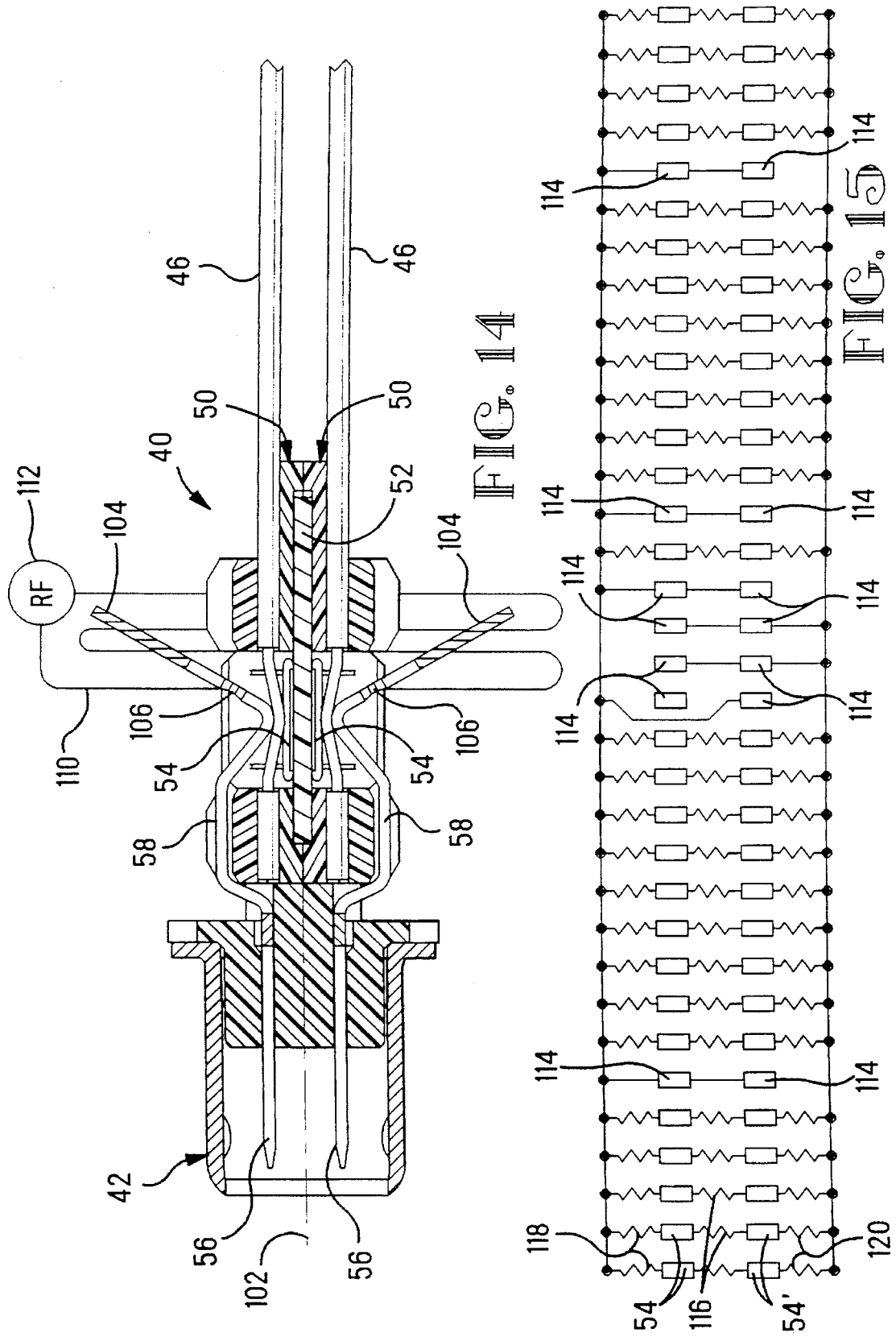

SCSI CABLE WITH TERMINATION CIRCUIT AND METHOD OF MAKING

The present invention is related to the manufacture of small computer system interface cables and more particularly to such cables having built in termination circuitry.

BACKGROUND OF THE INVENTION

The industry, including the American National Standards Institute, has developed a series of standards for small computer system interface (SCSI) cables which define the physical and electrical parameters of a parallel I/O bus used to interconnect computers and associated peripheral devices. Such peripheral devices include disk drives, tape drives, printers, CD-ROM drives, et al. A sample SCSI configuration is shown in FIG. 1. There, a host computer 10 is shown interconnected by a SCSI I/O bus 12 to a printer 14. Two other SCSI I/O cables 16 and 20 are daisy chained to a disk drive 18 and to a CD-ROM drive 22 by means of connectors 26 and 27. A separate terminator 24 containing bus termination circuitry is interconnected to the last unit in the chain in the usual manner. The daisy chain between the units 14, 18, and 22 is accomplished by means of commoning the conductors within the two connectors 26. When one of the units 14, 18, or 22 is removed from the system, a separate terminator, not shown but similar to the terminator 24, must be connected to the unmated connector so that the system remains operational. An example of the connector 27 is disclosed in U.S. Pat. No. 5,211,578 which issued May 18, 1993 to Henschen et al. and which is incorporated herein by reference. The '378 patent discloses an SCSI cable assembly utilizing a connector similar to that of the present invention and a solder nest for organizing the cable conductors and their associated connector leads for soldering. This cable assembly, however, has no provisions for a built in terminator circuit. As shown in FIG. 2, the host computer 10 may be interconnected to an I/O device 28 by means of an SCSI cable 30 having connectors 32 attached to each end as well as a separate feed through terminator 34 piggybacked to the connector attached to the device 28. With this configuration, when a device 28 is removed from the system, the terminator is already in place. However, this adds parts and cost to the system. Additionally, the terminator 34 adds to the space requirements of the cable and increases its bulk, both being undesirable results.

What is needed is an SCSI cable assembly having a terminator circuit that is arranged within the shell of the connector and interconnected to the conductors of the cable and their respective connector leads so that when a device is removed from the system the SCSI cable is automatically terminated. Additionally, an efficient and economical method of making the SCSI cable assembly is needed.

SUMMARY OF THE INVENTION

An SCSI cable assembly including a built in terminator is disclosed. The cable assembly includes an electrical cable having a plurality of conductors arranged on a desired spacing. A circuit board is included having a termination circuit thereon. A plurality of contact pads are on a first surface of the circuit board and are electrically interconnected to the termination circuit. The contact pads are arranged on the desired spacing of the plurality of conductors. An electrically insulating solder nest has a plurality of openings therein in registry with and closely adjacent the plurality of contact pads. Each of the openings being in registry with an associated respective contact pad. A portion of each of the conductors is arranged within a respective opening and in electrical engagement with its associated contact pad. An electrical connector is provided having a plurality of contact leads spaced on the desired spacing of the conductors. A portion of each lead is arranged within a respective opening and in electrical engagement with the conductor therein.

DESCRIPTION OF THE FIGURES

FIGS. 12, 13, and 14 are views of the solder nest assembly and connector of FIG. 4 shown in various stages of completion; and FIG. 15 is a schematic diagram showing a typical terminator circuit.

DESCRIPTION OF THE PREFERRED EMBODIMENT

Figure 1:
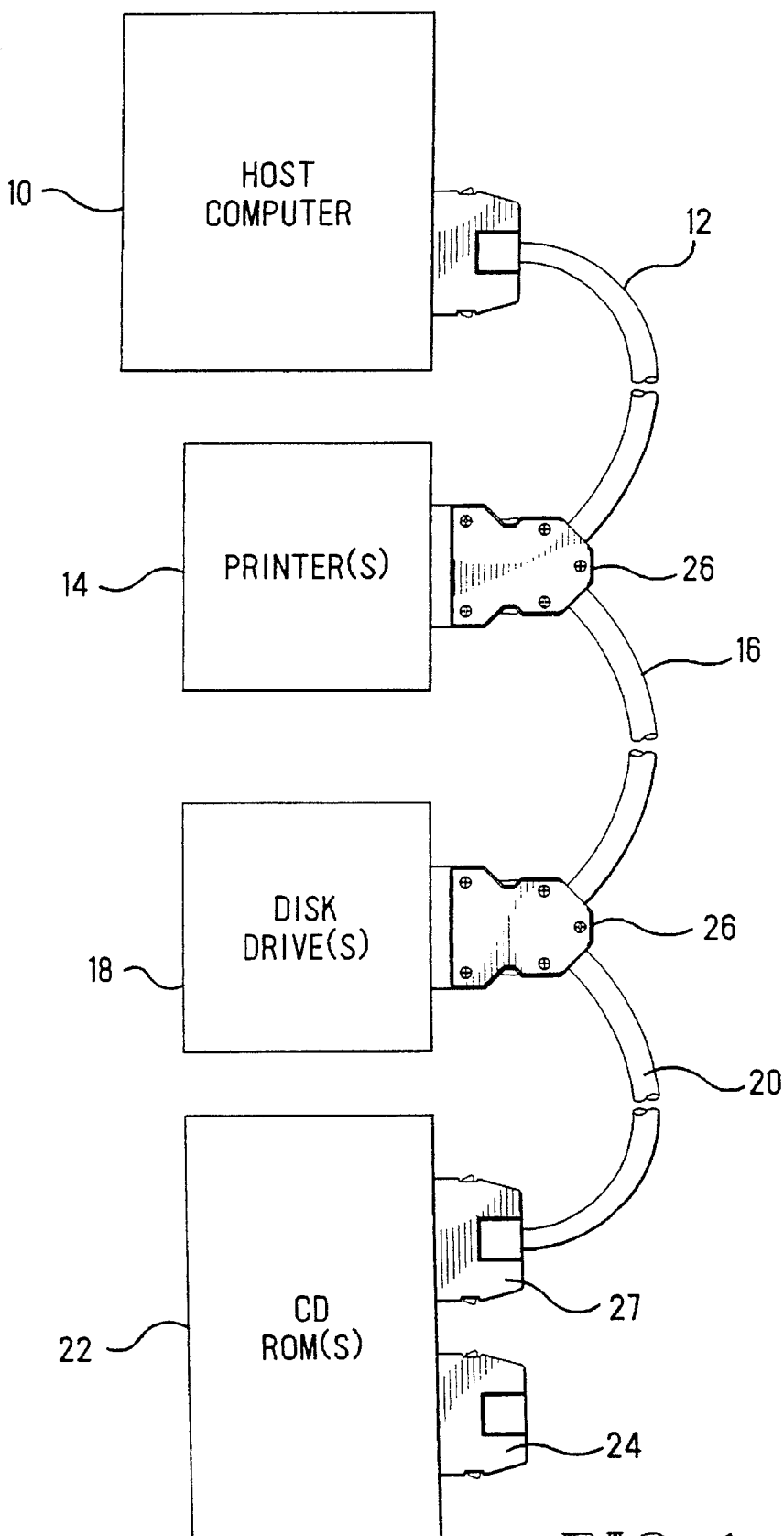
FIG. 1 is a representation of a typical SCSI cable application.
Figure 2:
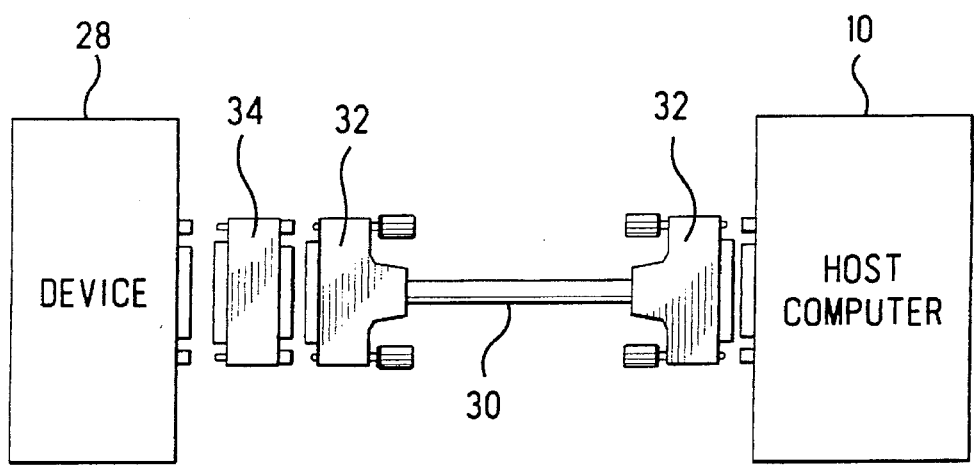
FIG. 2 is a simplified SCSI cable application showing a feed through terminator.
Figure 3:
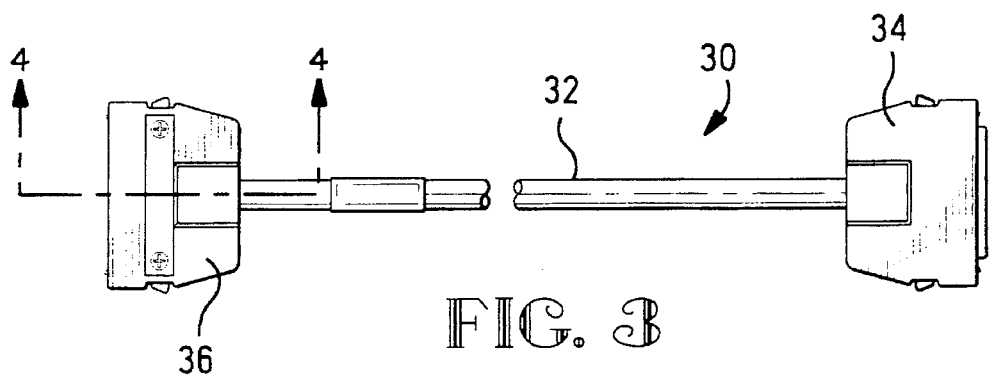
FIG. 3 is an SCSI cable assembly incorporating the teachings of the present invention.
Figure 4:
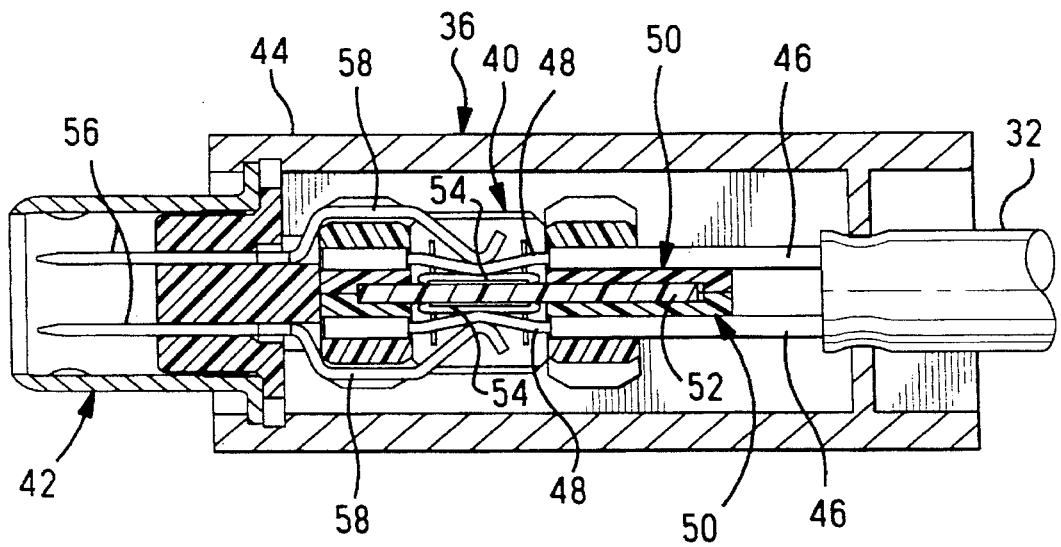
FIG. 4 is a cross-sectional view taken along the lines 4—4 in FIG. 3.

There is shown in FIG. 3 a cable assembly 30 including a multi-conductor cable 32 having on one end thereof an electrical connector 34 for connecting to the host computer 10 and on the other end thereof an electrical connector assembly 36, containing termination circuitry, for connecting to the device 28. As best seen in FIG. 4, the connector assembly 36 includes a solder nest assembly 40, an electrical connector 42, both of which are housed within an outer shell 44. The cable 32 includes a plurality of wires 46 having conductors 48. The insulation is stripped back to expose the conductors 48 for a short portion of their length near their ends, as shown. The solder nest assembly 40 includes two insulating solder nest halves 50, that will be described in detail below, and a circuit board 52 containing termination circuitry. A plurality of contact pads 54 and 54' are arranged on opposite surfaces of the circuit board 52 and interconnected to the termination circuitry. The contact pads 54 and 54' are arranged on a desired spacing that corresponds to the spacing of the conductors 48 in the solder nest halves 50, as will be explained below. The connector 42 includes a plurality of contacts 56 and solder tails or leads 58 that are arranged adjacent corresponding conductors 48. Each lead 58 is electrically connected to a respective corresponding conductor 48 and contact pad 54 and 54' by means of solder, in a manner that will be described below.

A typical termination circuit that may be utilized in the practice of the present invention is shown in the schematic diagram in FIG. 15. There, the contact pads 54 are shown forming a top row while the contact pads 54' are shown forming a bottom row. Several contact pads 114 are provided for ancillary purposes that are unrelated to the teachings of the present invention. Each contact pad 54 is interconnect with a corresponding contact pad 54' through a respective resistor 116, having a resistance of about 150 ohms. Additionally, a plurality of 330 ohm resistors 118 are arranged so that each is connected to a respective contact pad 54 while the other ends of the resistors 118 are commoned. Similarly, a plurality of 330 ohm resistors 120 are arranged so that each is connected to a respective contact pad 54' while the other ends of the resistors 120 are commoned. This is a typical termination circuit for a bus having twisted pairs of conductors. The values of the resistors 116, 118, and 120 and their interconnections with the contact pads 54 and 54' are by way of example only. Other termination circuits may be advantageously utilized in the practice of the present invention.

Figure 5:
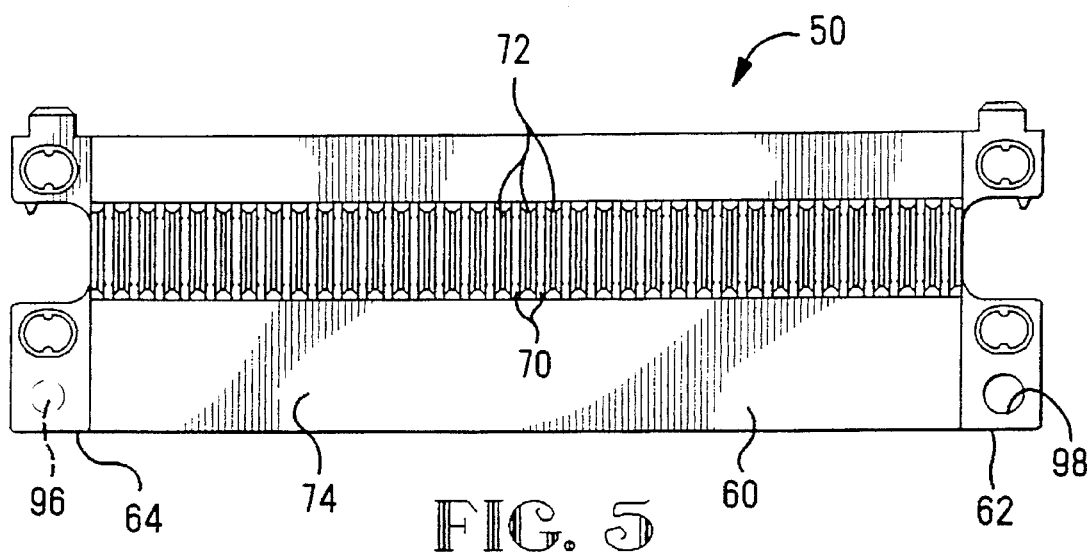
FIGS. 5, 6, 7, and 8 are front, side, bottom, and end views, respectively, of a solder nest half utilized in the cable assembly shown in FIG. 4.
Figure 6:
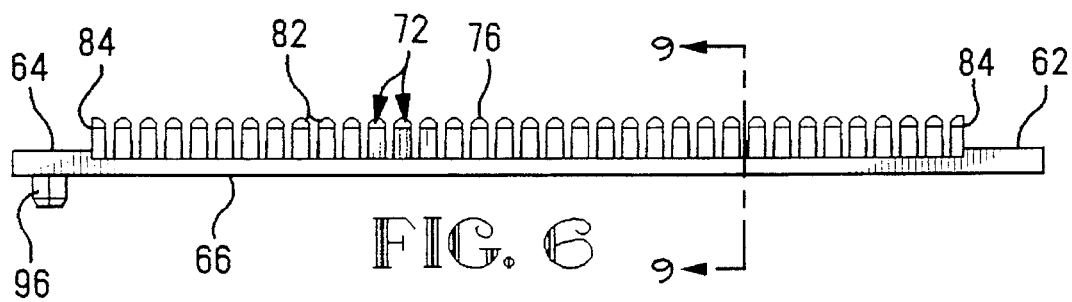
Figure 7:
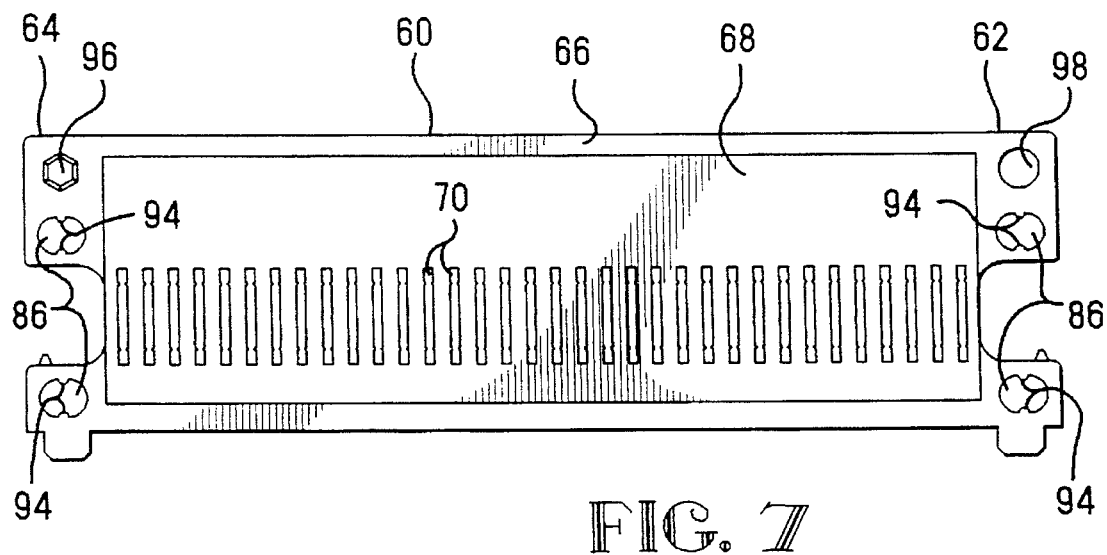
Figure 8:
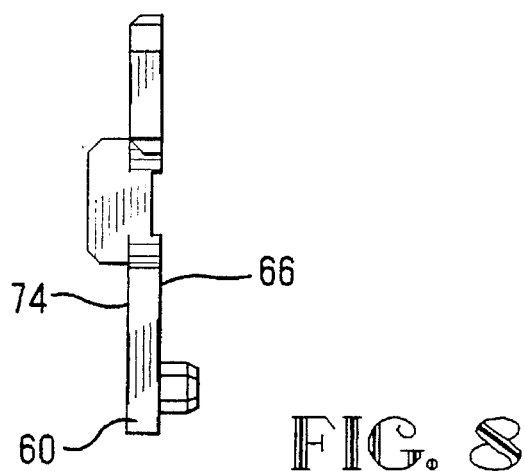
Figure 9:
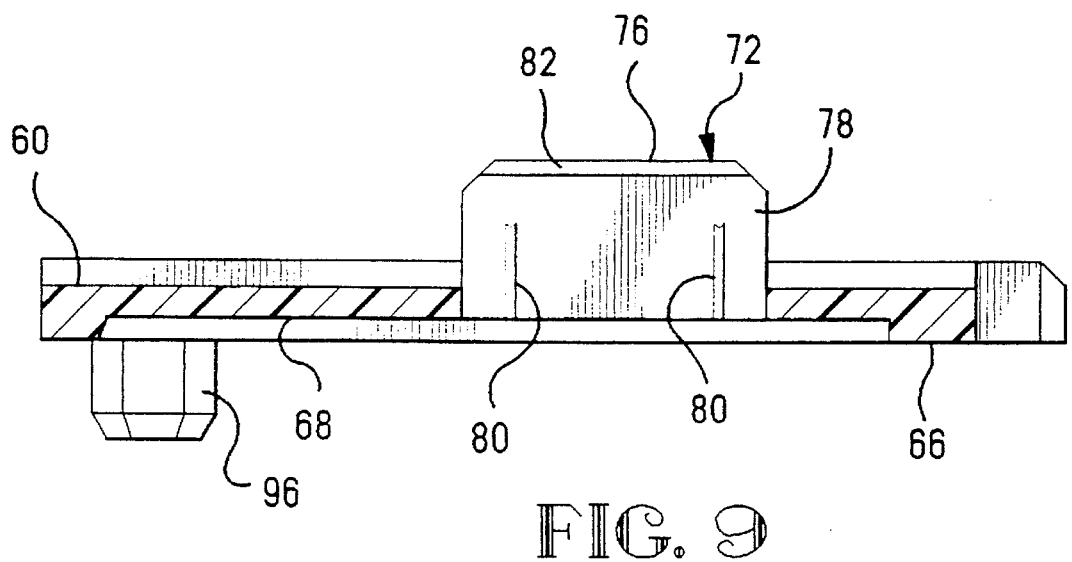
FIG. 9 is a cross-sectional view taken along the lines 9—9 in FIG. 6.
Figure 10:
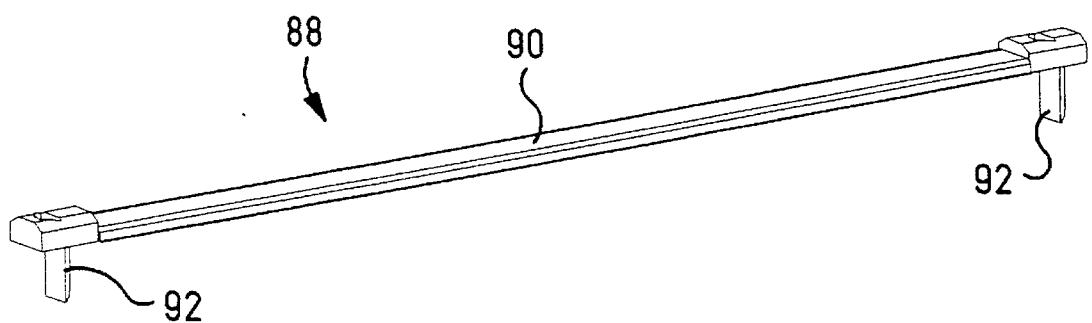
FIG. 10 is an isometric view of a hold down bar utilized in the cable assembly shown in FIG. 4.

As shown in FIGS. 5 through 9, each solder nest half 50 includes a substantially planar body 60 having mounting flanges 62 and 64 at either end thereof. A substantially flat mounting surface 66 extends along the entire length of one side of the body 60 and includes a rectangularly shaped recess 68 formed therein sized to closely receive the circuit board 52 with little clearance. A plurality of openings 70 extend completely through the body 60 and are arranged in a row, as shown in FIG. 7, and spaced so that they correspond to the desired spacing of the conductors 48. The openings 70 are further arranged within the recess 68 so that, when a circuit board 52 is disposed within the recess, each opening is in registration with a corresponding contact pad 54, 54', each such contact pad being in alignment with a respective opening 70. A plurality of ribs 72 extend upwardly from a top surface 74 of the body 60, as best seen in FIGS. 6 and 7. Each rib 72 is disposed between two adjacent openings 70 so that the opposing walls of adjacent ribs are on opposite sides of each opening 70 effectively extend the opening upwardly to the top 76 of the ribs. The extended portion of each of the openings, considered herein as part of the opening 70, is sized to receive one of the conductors 48 and an associated contact lead 58. Each side wall 78 of each rib 72, as best seen in FIG. 9, includes two spaced apart vertical ribs 80 that extend upwardly from the recess 68 about three quarters of the height of the rib 72. These vertical ribs extend into the extended portions of the openings 70 a slight amount to provide an interference fit between the conductor 48, lead 58, and the opening 70 and serves to retain the conductor and lead within the opening until soldering is complete. Additionally, each rib 72 includes chamfers 82 that serve as lead-ins when inserting the conductors 48 and the leads 58 into the openings 70. An end rib 84 is disposed at each end of the row of ribs 72, as best seen in FIG. 6, to extend the two end openings 70 in a manner similar to that of the other openings 70 by the ribs 72. Two elongated holes 86 are disposed in each flange 62 and 64, as shown in FIGS. 5 and 7 for receiving cleats 92 of a pair of hold down bars 88, shown in FIG. 10. The hold down bar 88 includes a relatively long and narrow rail 90 having a cleat 92 extending at right angles, with respect to the rail, from each end. Each of the elongated holes 86 is sized to receive two of the cleats 92, entering the holes from opposite sides, for a purpose that will be explained below. Each elongated hole 86 has a pair of opposing barbs extending thereinto that interfere with the cleats 92 thereby retaining them within the elongated holes. As best seen in FIGS. 6 and 7, the flange ∝includes a hexagonal shaped pin 96 extending from the mounting surface 66 while the opposite flange 62 has a hole 98 formed therethrough sized to interferingly receive the hexagonal pin of another solder nest half. The pin 96 and hole 98 are positioned so that when two of the solder nest halves 50 are mated with their respective mounting surfaces 66 in abutting engagement and the pin 96 of each half in the hole 98 of the other half, the two recesses 68 are in precise mutual alignment and thereby form a cavity for receiving and retaining the circuit board 52. Additionally, the two elongated holes 86 in the flange 62 of one solder nest half 50 are in alignment with the two elongated holes 86 in the flange 64 of the other solder nest half. The two solder nest halves 50 are made of any suitable dielectric material, as for example, Vectra A130 which is manufactured by Hoechst Celonese Corporation of 26 Main Street, Chatham N.J. 07928.

Figure 11:
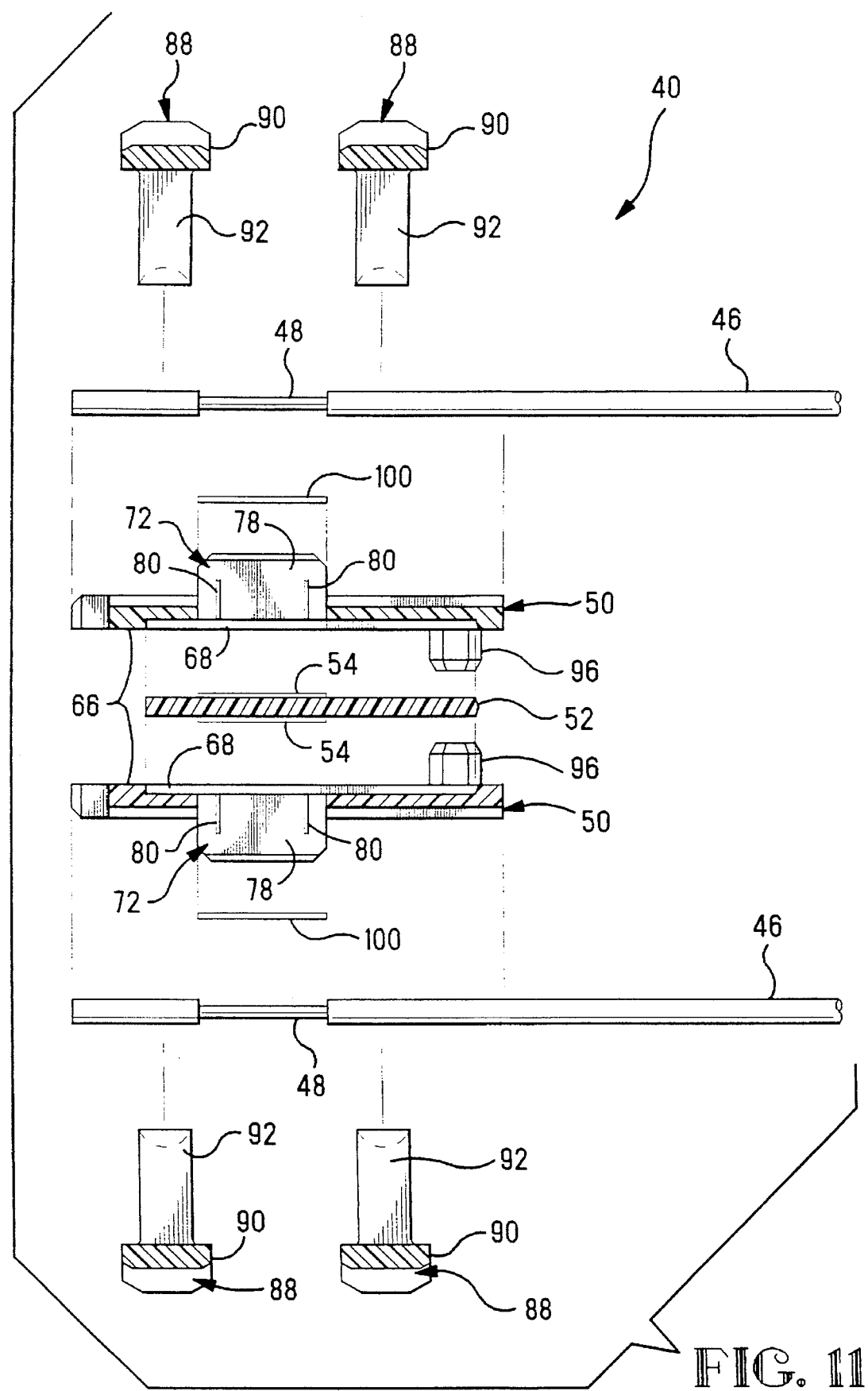
FIG. 11 is an exploded parts view of the solder nest assembly of the cable assembly shown in FIG. 4.

As shown in FIG. 11, the solder nest assembly 40 is assembled by abutting the two mounting surfaces 66 of two solder nest halves 50 together with a circuit board 52 sandwiched therebetween in the cavity formed by the two recesses 68, the two hexagonal pins 96 being in their respective holes 98. A plurality of solder segments 100 cut from solder wire to uniform lengths are inserted into the extended portions of the openings 70, one solder segment in each opening. As the solder segments are inserted, they engage the vertical ribs and deform slightly as they are pushed to the bottom of the openings 70 in engagement with their respective contact pads 54, 54' on the circuit board. The vertical ribs 80 serve to temporarily retain the solder segments in place. Alternatively, in place of the solder segments 100, solder or solder paste may be deposited directly onto the contact pads 54, 54' thereby forming solder segments insitu. Such deposition may be accomplished by any suitable means. Additionally, solder segments 110 may be used in combination with solder, or solder paste deposited directly onto the contact pads. As used herein, the term "solder segments" will mean solder wire segments or preforms, deposited solder or any combination thereof. The individual wires 46 of the cable 32 are then fanned out in the usual manner and striped to expose the conductors 48 as shown. The length of the bare portion of the conductor 48 is similar to the length of the ribs 72. The conductors are then inserted into the extended portions of the openings 70 until they are in thermal engagement with the solder segment 100. This may require that the conductors be bent slightly to compensate for the thickness of the wire's insulation. As the conductors are pushed into the openings 70 they deform the vertical ribs a slight amount which serves to temporarily retain the conductors within the openings 70 until soldering. The wires 46 had been stripped so that an insulated portion of each wire lies on each side of the two ribs 72. The wires 46 are secured in place by means of the four hold down bars 88, the cleats 92 being inserted into the elongated holes 86, as set forth above, until the four rails 90 engage the outer insulation of the wires 46 on either side of the row of openings 70. This completes the solder nest assembly 40.

As shown in FIGS. 12, 13, and 14, the solder nest assembly 40 is assembled to the connector 42 by aligning it and the connector on a common longitudinal center line 102. The opposing leads 58 of the connector 42 are then spread apart within their elastic limit, as shown in FIG. 13, and the connector moved along the center line 102 toward the solder nest assembly until the leads begin to enter their respective openings 70 between the ribs 72. As the leads 58 pass the rails 90 and enter the openings 70, they spring back to their original position and engage their respective conductors 48 that are in the openings. Each opening 70, and its extended portion, has a respective lead 58, conductor 48 and solder segment 100 disposed therein in alignment with a respective contact pad 54, 54', thereby forming associated groups. In this position, as shown in FIG. 14, each of the leads 58 is in thermal engagement with its associated conductors 48 which is in thermal engagement with its respective solder segment 100. It is preferred that the leads 58 be shaped and dimensioned so that they supply a spring bias urging the leads against their respective conductors 48. Additionally, as seen in FIGS. 12, 13, and 14, each of the leads 58 terminates in a single carrier strip 104, each lead having a break-off notch 106 so that it can be separated from the carrier strip after soldering.

The carrier strip 104 includes a layer of metal having high permeability and high electrical resistance, such as Alloy 42 (42 percent nickel, 58 percent iron) of a thickness of between about 0.0003 inch and 0.0007 inch. The metal layer may be attached to the carrier strip by any suitable means such as being clad onto the surface of the carrier strip 104 which comprises, preferably, copper alloy such as Alloy No. C511000, phosphor bronze. This clad carrier strip 104 defines a Curi point heater that is well known in The industry. The assembly of the solder nest assembly 40 and the connector 42 is placed within a coil 110 and subjected to RF current for several seconds. The current is supplied by an RF generator 112 and is of constant amplitude at a frequency of about 13.56 mega Hertz, for example. The carrier strip 104 achieves a temperature of about 240 degrees centigrade, the thermal energy being conducted along the leads 58 to the conductors 48 and then to the solder segments 100. The solder segments heat sufficiently to reflow and surround the points of contact between the leads 58 and their associated conductors 48 and contact pads 54, 54'. The RF current is then removed and the solder is fused to form a good electrical connection within each group of lead, conductor, and contact pad. The solder segment 100 can be, for example, Sn 63 tin-lead having a reflow temperature of about 183 degrees centigrade. After soldering, the carrier strip 104 is manipulated to break each of the leads 58 at their respective break-off notches 106 and discarded. The soldered assembly is then assembled to the case 44 in the usual manner thereby completing the connector assembly 36.

The electrical connector 42 is more fully described in the above referenced '578 patent, however, it will be understood that any similar such connector may be advantageously utilized in the practice of the present invention. Further, while the present invention is described with reference to SCSI applications, its teachings apply equally to other systems that require a terminator to maintain system operation when a unit is removed from the system. Such systems include token ring and other communications networks.

Curi point heating by self regulating temperature sources, as described herein, is disclosed in U.S. Pat. Nos. 4,852,252; 4,256,945; and 4,659,912 and RF generators are disclosed in U.S. Pat. Nos. 4,626,767 and 4,789,767.

An important advantage of the present invention is that an SCSI cable assembly is provided having a termination circuit that is arranged within the shell of the connector thereby eliminating a separate part. Additionally, when a device is removed from the system the SCSI cable is automatically terminated so that the system remains operational. Another important advantage is that the method of making the SCSI cable assembly is efficient and economical. By providing a controlled maximum amount of thermal energy in a highly localized area for only a brief time, possible adverse effects of heat on the circuit board 52 and other structures is minimized.

We claim:

1. A cable assembly with conductors of a cable terminated with resistors comprising:

resistors on a circuit board, the circuit board having contact pads on spaced apart centerlines, with corresponding contact pads being connected to corresponding resistors, an insulating solder nest received over the circuit board, the circuit board having multiple openings on spaced apart centerlines, the openings being over corresponding contact pads, solder segments received over corresponding contact pads and received within corresponding openings, an electrical cable having multiple conductors fanned out and received over respective solder segments, and multiple electrical contacts in an insulating housing with solder tails on the electrical contacts engaged on respective conductors of the electrical cable, and each solder segment providing a fused solder electrical connection of a corresponding conductor and a corresponding electrical contact to a corresponding contact pad connected to corresponding resistors.

2. A cable assembly as recited in claim 1 wherein, the solder tails are attached to a copper alloy carrier strip clad with a layer of metal having a high permeability and low electrical resistance to provide a Curie point heater.

3. A cable assembly as recited in claim 1 wherein, the contact pads are in two rows, the rows are on opposite surfaces of the circuit board, said resistors comprise, first resistors and second resistors, each first resistor interconnecting one contact pad in each of the two rows with each other, the second resistors being in two rows, the second resistors in the same row being electrically commoned, and each second resistor being connected to one contact pad.

4. A cable assembly as recited in claim 1 wherein, the circuit board is enclosed by the solder nest.

5. A cable assembly as recited in claim 1 wherein, the contact pads are in two rows, the rows are on opposite surfaces of the circuit board, the solder nest comprises, a pair of insulating bodies over the opposite sides of the circuit board, the openings are in respective insulating bodies, respective conductors of the cable extend over respective contact pads on opposite sides of the circuit board, and respective solder tails extend over respective conductors of the cable.

6. A cable assembly as recited in claim 5 wherein, the solder tails are springs engaged against respective conductors of the electrical cable with spring forces.

7. A cable assembly as recited in claim 5 wherein, said resistors comprise, first resistors and second resistors, each first resistor interconnecting one contact pad in each of the two rows with each other, the second resistors being in two rows, the second resistors in the same row being electrically commoned, and each second resistor being connected to one contact pad.

8. A cable assembly as recited in claim 5 wherein, the circuit board is enclosed by the insulating bodies.

9. A cable assembly as recited in claim 5 wherein, the solder tails are attached to a copper alloy carrier strip clad with a layer of metal having a high permeability and low electrical resistance to provide a Curie point heater.

10. A cable assembly as recited in claim 9 wherein, the solder tails are springs engaged against respective conductors of the electrical cable with spring forces.

11. A cable assembly as recited in claim 9 wherein, said resistors comprise, first resistors and second resistors, each first resistor interconnecting one contact pad in each of the two rows with each other, the second resistors being in two rows, the second resistors in the same row being electrically commoned, and each second resistor being connected to one contact pad.

12. A cable assembly as recited in claim 9 wherein, the circuit board is enclosed by the insulating bodies.

* * * * *